United States Patent
Kishimoto et al.

(10) Patent No.: US 11,005,082 B2
(45) Date of Patent: May 11, 2021

(54) ORGANIC EL LIGHT-EMITTING ELEMENT AND MANUFACTURING METHOD THEREOF

(71) Applicant: SAKAI DISPLAY PRODUCTS CORPORATION, Sakai (JP)

(72) Inventors: Katsuhiko Kishimoto, Sakai (JP); Yukiya Nishioka, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/616,438

(22) PCT Filed: Nov. 28, 2017

(86) PCT No.: PCT/JP2017/042622
§ 371 (c)(1),
(2) Date: Mar. 18, 2020

(87) PCT Pub. No.: WO2019/106717
PCT Pub. Date: Jun. 6, 2019

(65) Prior Publication Data
US 2020/0266394 A1 Aug. 20, 2020

(51) Int. Cl.
*H01L 51/56* (2006.01)
*H01L 51/00* (2006.01)

(52) U.S. Cl.
CPC .......... *H01L 51/56* (2013.01); *H01L 51/0005* (2013.01); *H01L 51/0007* (2013.01); *H01L 51/0035* (2013.01)

(58) Field of Classification Search
CPC .......................... H01L 51/56; H01L 51/0005
See application file for complete search history.

(56) References Cited

U.S. PATENT DOCUMENTS

| 2005/0153114 | A1 | 7/2005 | Gupta et al. |
| 2006/0159842 | A1 | 7/2006 | Gupta et al. |
| 2008/0220289 | A1 | 9/2008 | Shioya et al. |
| 2008/0233429 | A1 | 9/2008 | Oguma et al. |
| 2008/0241592 | A1 | 10/2008 | Fujita |
| 2009/0239045 | A1 | 9/2009 | Kato et al. |
| 2010/0051912 | A1 | 3/2010 | Gregory |
| 2020/0220081 | A1* | 7/2020 | Kishimoto .......... H01L 27/3246 |
| 2020/0280014 | A1* | 9/2020 | Kishimoto ............. H05B 33/10 |

(Continued)

FOREIGN PATENT DOCUMENTS

| JP | 2004-055177 A | 2/2004 |
| JP | 2004-127933 A | 4/2004 |

(Continued)

OTHER PUBLICATIONS

International Search Report of PCT/JP2017/042622.

*Primary Examiner* — Douglas M Menz
(74) *Attorney, Agent, or Firm* — ScienBiziP, P.C.

(57) ABSTRACT

An organic EL light-emitting element is provided in which, by means of an organic material that is a oligomer with a molecular weight of 300-5000, an organic layer coated film 25 is formed in a high-definition pixel pattern in the openings 23a of insulation banks 23 that are formed with a hydrophilic material; a manufacturing method of said organic EL light-emitting element is also provided. The coated film 25 is formed by dropwise injection of a liquid composition containing an organic material oligomer.

12 Claims, 3 Drawing Sheets

(56) References Cited

U.S. PATENT DOCUMENTS

2020/0303648 A1* 9/2020 Nishioka .............. H01L 51/0035
2020/0312929 A1* 10/2020 Kishimoto .......... H01L 51/0005

FOREIGN PATENT DOCUMENTS

| | | |
|---|---|---|
| JP | 2006-032939 A | 2/2006 |
| JP | 2006-324021 A | 11/2006 |
| JP | 2008-130972 A | 6/2008 |
| JP | 2008-218952 A | 9/2008 |
| JP | 2008-244053 A | 10/2008 |
| JP | 2009-266580 A | 11/2009 |
| JP | 2010-504608 A | 2/2010 |
| JP | 2010-205528 A | 9/2010 |
| JP | 2011-223015 A | 11/2011 |
| JP | 2012-059553 A | 3/2012 |
| JP | 2012-204202 A | 10/2012 |
| JP | 2015-015178 A | 1/2015 |
| JP | 2016-001581 A | 1/2016 |
| WO | 2005/069403 A2 | 7/2005 |
| WO | 2007/049631 A1 | 5/2007 |

\* cited by examiner

ORGANIC EL LIGHT-EMITTING ELEMENT AND MANUFACTURING METHOD THEREOF

TECHNICAL FIELD

The present disclosure relates to an organic EL light-emitting element (organic electroluminescent light-emitting element) and a method of manufacturing the same.

BACKGROUND ART

An organic EL light-emitting element is formed such that a thin layer of organic material containing an organic light-emitting substance is sandwiched between an anode and a cathode. This organic thin layer is formed by a vapor deposition method or a coating method. In a method of manufacturing of a vapor-deposition type organic thin layer, a supporting substrate (a substrate to be vapor-deposited) and a deposition mask are arranged overlapped, an organic material is vapor-deposited in vacuum through an opening of the deposition mask, and a thin layer is formed on the supporting substrate. In general, low molecular weight compounds are used as an organic material for a vapor-deposition type organic material. On the other hand, in a method of manufacturing of a coated-type organic EL light-emitting element, a thin layer is formed on a supporting substrate using a solution for, for example, a printing process such as a screen printing, an ink-jet process. An organic EL light-emitting element which is produced by a coating process can be produced at a lower manufacturing cost compared to an organic EL light-emitting element which is produced by a vapor-deposition process since, for example, it does not require an expensive vapor mask or equipment for high vacuum process, and an efficiency in use of an organic material in a coating process is higher than a vapor-deposition process. However, it is difficult to produce a good quality thin layer using a coating process since low molecular weight compounds tend to be easily crystalized. Therefore, polymer compounds having a high amorphous property have been used as an organic material in the coating process. For example, Patent Document 1 describes a polymer compound containing a specific repeating unit as an organic material for a coated-type organic EL light-emitting element, which can be used as a light-emitting material or charge transport material. A polymer compound used in a coating process usually contains at least a number of several tens or more of such repeating units.

PRIOR ART DOCUMENT

Patent Document

Patent Document 1: JP 2011-223015 A

SUMMARY OF THE INVENTION

Problems to be Solved by the Invention

As mentioned above, a polymer compound is used for an organic material for a coated-type organic EL light-emitting element. However, in the conventional coated-type organic EL light-emitting element, it is difficult to coat an organic material in a minute dot pattern since a size of a droplet of the organic material is hardly reduced even using an ink-jet method. An attempt has been made to have a coating solution within a pixel by devising an insulation bank arrangement when the display apparatus is large-sized and the pattern formation has large area, for example, a size of each pixel for the display apparatus is a long-side length of 210 μm or more and a short-side length of 70 μm or more.

However, an area for each pixel of the display apparatus becomes very small with the reduced weight, size, and thickness and the high definition of the recent electronic apparatus such as a portable device, making unable to separately coat on each pixel even using an ink-jet method, since the droplet spreads across more than one pixels. Also, the purification of polymer compounds is difficult, and it is hard to obtain highly purified polymer compounds. Therefore, when the polymer compounds are used for an organic EL light-emitting element, a luminescent color purity, a light emission efficiency, a brightness and so on might be reduced. Further, if the molecular weight of the polymer compound becomes too high, forming a homogeneous layer may become difficult due to a gelation of polymer compounds.

Further, it has been generally known that the light emission efficiency of the low molecule weight compounds is greater than that of the polymer compounds, the life of the low molecule compounds is longer than that of the polymer compounds, variations in color realized with the low molecule weight compounds is greater than that realized with the polymer compounds, and the performance in blue light emission of the low molecule weight compounds is especially superior compared to that of the polymer compounds. However, a coating solution containing a low molecule weight compound has a high fluidity, thereby the coating solution spreads right after being ejected from a discharge nozzle of the ink-jet apparatus, making it difficult to form a liquid drop of good quality, and, since the low molecule weight compounds tend to be easily crystalized as described above, a layer of a low molecule material is formed in such a way that the material is inhomogeneously distributed, and thus it is difficult to use low molecule weight compounds for a conventional method of manufacturing a coated-type organic EL light-emitting element.

As described above, when the polymer compounds are used for an organic material, it is difficult to prepare a small liquid drop. Therefore, when a pixel size becomes small, a problem arises that a separate coating with high definition on an electrode of the small pixel is unable to be carried out even using an ink-jet method. Meanwhile, as a result of extensive studies, the inventors have found that a small-sized liquid droplet can be obtained by using an oligomer of an organic material and a separate coating of even a small area can be carried out.

The present invention has been made in view of such circumstances as mentioned above, and an object of the present invention is to provide an organic EL light-emitting element with an insulation bank formed to be hydrophilic so as to have a better wettability between a coating solution and an insulation bank, by using an inexpensive printing method for the organic layer formation, and a manufacturing method thereof.

Means to Solve the Problem

An organic EL light-emitting element according to the first embodiment of the present application comprises a substrate, a first electrode provided on a surface of the substrate, an insulation bank formed to surround at least part of the first electrode, an organic layer formed on the first electrode surrounded by the insulation bank, and a second electrode formed on the organic layer, wherein the insulation bank is formed by a material having a hydrophilic property, and the insulation bank has a forward tapered shape or a sidewall of the insulation bank is formed such as to be substantially perpendicular to the first electrode, the organic layer is a coated-type organic layer comprising an oligomer of an organic material, and the oligomer has a molecular weight of 300 or more and 5000 or less.

A method of manufacturing an organic EL light-emitting element according to the second embodiment of the present application comprises forming a first electrode on a surface of a substrate, forming an insulation bank by a hydrophilic resin material to surround at least part of the first electrode, forming a coated-type organic layer on an area of the first electrode surrounded by the insulation bank, and forming a second electrode on the organic layer, wherein the insulation bank is formed to have a contact angle to water of 15° or more and 60° or less using a hydrophilic material, and a step for forming the organic layer is conducted by applying a droplet of a liquid composition comprising an oligomer of an organic material using an ink-jet process.

Effect of the Invention

According to the first embodiment of the present application, an organic EL light-emitting element is formed with a coated-type organic layer containing an oligomer of an organic material with a molecular weight of 300 or more and 5000 or less, thereby it is not necessary to subject an insulation bank to a liquid repellent treatment. Thus, a deterioration of the organic layer by fluorine which is contained in a material for a liquid repellent property or introduced in a material by a surface treatment does not occur. Further, since there is no need to form an insulation bank in a reversed tapered shape, manufacturing can be facilitated and an occurrence of a stepwise disconnection of a second electrode can be prevented. A coated-type organic EL light-emitting element is provided in which each pixel of a display apparatus can be constituted by a separate coating of even a very small light-emitting area with a size of, for example, 10 μm square to 50 μm square. Further, according to the second embodiment of the present application, since a coating solution containing an oligomer of an organic material is used and thus a small-sized liquid droplet is ejected and dropped using an ink-jet process, an organic EL light-emitting element in which a coated-type organic layer is formed in a high definition pattern can be provided. Therefore, a coating solution does not overflow an insulation bank even when an insulation bank is formed by a hydrophilic material, and a precise coating of a small area can be conducted. Further, since an insulation bank is formed using a hydrophilic material with a contact angle to water of 15° or more and 60° or less, a coating solution can be coated uniformly inside an opening surrounded by the insulation bank until reaching a sidewall of the insulation bank. A flatness of a coated layer can be retained during a formation of an organic layer, i.e. during a drying process of the coated layer. Consequently, a small, high-definition organic EL light-emitting element having a superior light-emitting property with a suppressed luminance unevenness can be obtained at a low cost and a small, high-definition display apparatus can be manufactured inexpensively.

EMBODIMENT FOR CARRYING OUT THE INVENTION

The invention will be further described below. The embodiments described below are intended only to provide an example of the disclosure and the invention is not limited to certain embodiments described below.

Figure 1A:
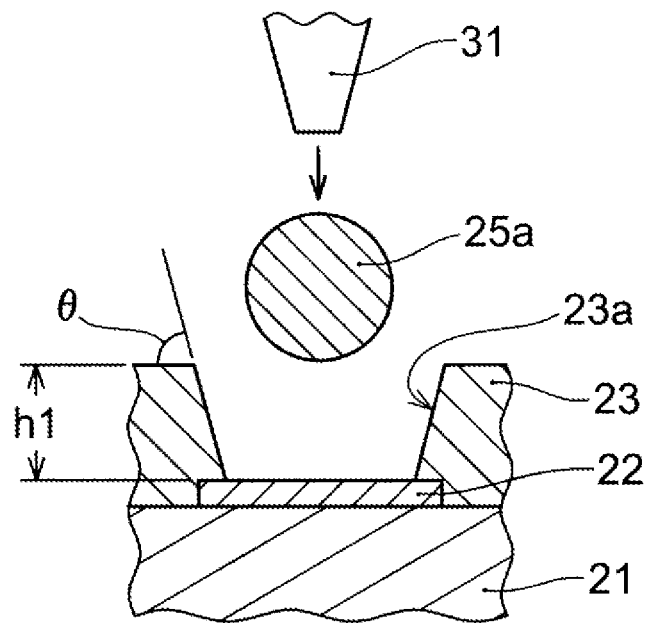
FIG. 1A shows a coating process in a method of manufacturing an organic EL light-emitting element according to one embodiment of the present application.
Figure 1B:
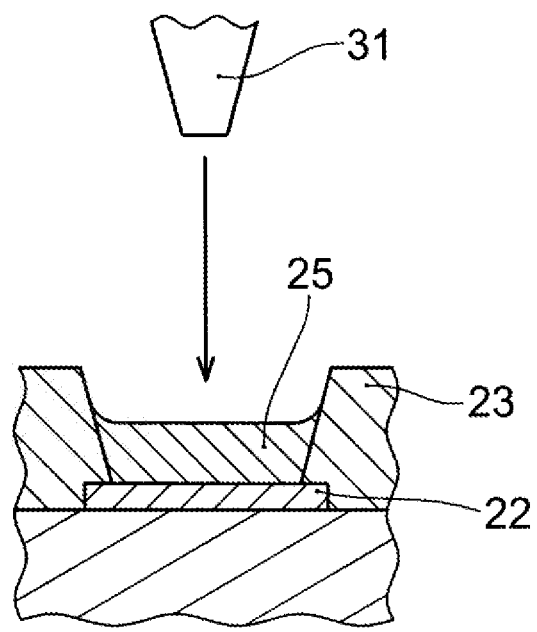
FIG. 1B shows a state in which a coated layer containing an oligomer of an organic material is formed on an electrode during a manufacturing process.
Figure 1C:
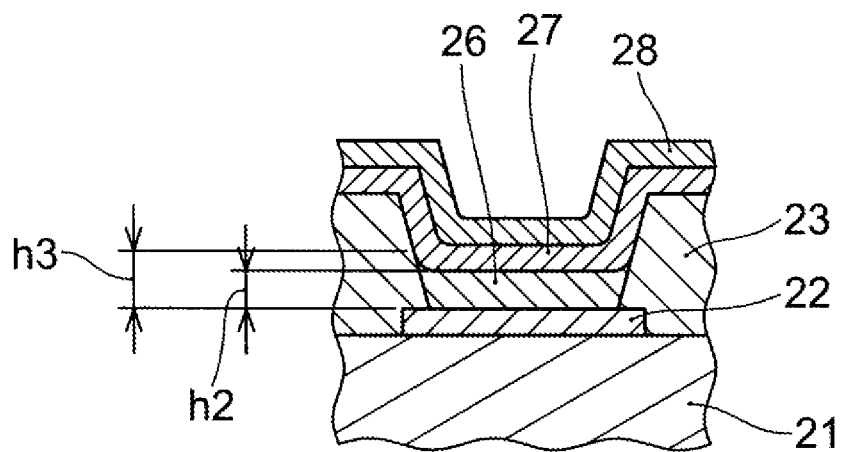
FIG. 1C shows a cross-sectional view of an organic EL light-emitting element according to one embodiment of the present application.

As illustrated in FIG. 1C, which shows a schematic cross-sectional view of an organic EL light-emitting element, an organic EL light-emitting element according to the presently illustrated embodiment comprises a substrate 21, a first electrode 22 (an anode, for example) provided on a surface of the substrate 21, an insulation bank 23 formed to surround at least part of the first electrode 22, an organic layer 26 formed on the first electrode 22 surrounded by the insulation bank 23, a second electrode 27 formed on the organic layer 26, and a protection layer 28 formed on the second electrode 27. The insulation bank 23 formed by a hydrophilic material has a forward tapered shape or a shape in which a sidewall of the insulation bank 23 is substantially perpendicular to the first electrode 22, and the organic layer 26 is formed by a coated-type organic layer containing an oligomer of an organic material with a molecular weight of 300 or more and 5000 or less.

The term "coated-type organic layer" is used herein to refer to the organic layer prepared by drying a coated layer formed by coating process, for example, a coated layer of an organic material formed using a dispenser and a coated layer formed by a printing process such as a screen printing or an ejection of organic material drops by ink-jet process. When a shape of a sidewall of the insulation bank 23, which forms an opening, is formed such that a spacing between sidewalls of the insulation bank 23 in a vertical cross sectional view is increased from a surface of the first electrode 22 toward a top surface of the insulation bank 23, the shape of the insulation bank 23 is referred to herein as "forward tapered shape". The term "formed to have a hydrophilic property" is used herein to refer to not only what is formed by specifically being subjected to a hydrophilic treatment but also what has no liquid repellent property obtainable by using a material with a liquid repellent property or through a liquid repellent treatment.

As described above, the conventional, coated-type organic EL light-emitting element has a problem in that the element cannot be formed in a small-sized light-emitting area. When coating an organic material on an area of the electrode, which will constitute each pixel, by, for example, ink-jet process for manufacturing a display apparatus, it is necessary to adjust a physical property of a coating solution ejected from a nozzle of ink-jet apparatus and optimize a ejecting speed of a liquid drop of a coating solution when ejected and a printing condition of an ink-jet apparatus, however, the inventors have found out that among those a size of a liquid drop of a coating solution when being ejected is an important factor to determine a possible size of an area to which an organic layer is provided, and that it is very important to adjust a size of a liquid drop to a desirable size at a pattern forming using an ink-jet process. With a conventional coating solution, a volume of a liquid drop when a coating solution of an organic material being ejected using an ink-jet process is about 5 pL to 30 pL in average, and it is impossible to reduce the volume of a coating solution per one drop to 1 pL or less. However, as a result of the inventors' extensive studies, the inventors found out that the reason why a size of the conventional liquid drop cannot be reduced is attributed to a polymer with a high molecular weight. The inventors found out that a droplet of 0.05 to 1 pL can be obtained by using an oligomer having a molecular weight of 5000 or less.

Figure 2:
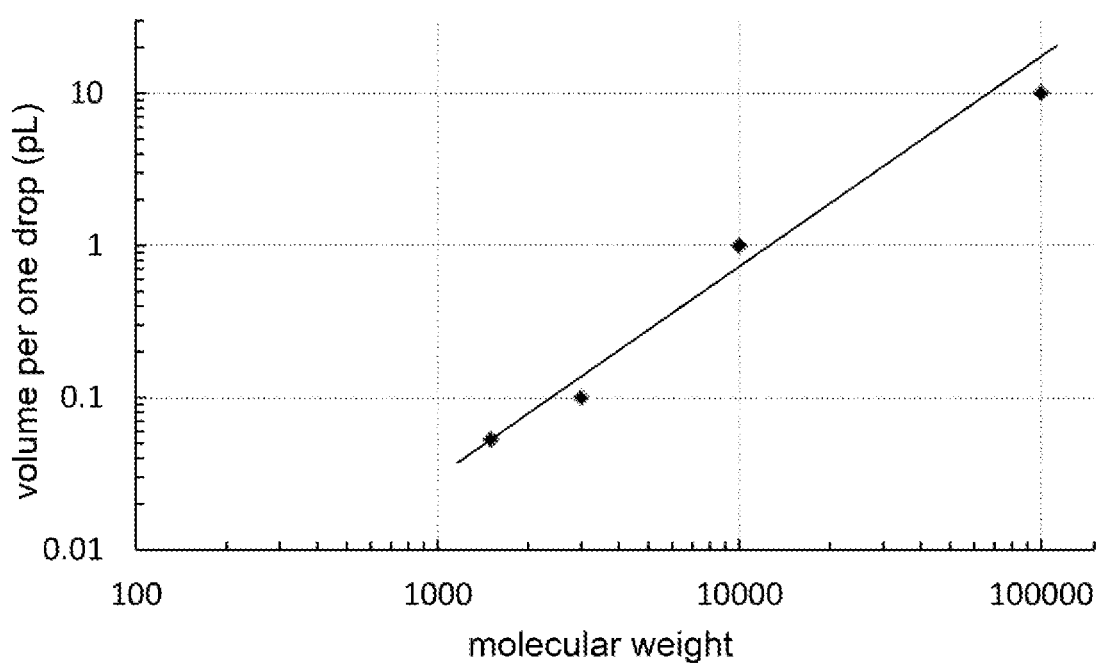
FIG. 2 shows a relation of a volume per one drop of a liquid drop of a coating solution to a molecular weight of a compound in a coating solution for an ink-jet process.

As a result of further extensive studies of inventors, the inventors found out that a size of a liquid drop is largely affected by a molecular weight of an organic material, as shown in FIG. 2. In other words, the inventors ascertain that the reason why small droplets cannot be formed is attributed to a fact that a solute (an organic material) in the conventional coating solution is a polymer compound having a high degree of polymerization and a large molecular weight of 10000 or more. It is considered that a size of a liquid drop is affected by a concentration of an organic material in a coating solution (a solubility of an organic material in a solvent) or a viscosity of a coating solution, however, the inventors conducted a test under the condition in which a concentration is as high as possible, yet a dropping of the solution is enable to be conducted.

As a result, as can be seen in FIG. 2, the inventors found out that when a molecular weight is 300 or more and 5000 or less, preferably about 3000 or less, more preferably 500 or more and 1000 or less, a liquid droplet volume per one drop can be set to about 0.05 pL to about 1 pL. The inventors conducted various studies with different polymerization methods and tested various compounds with a smaller molecular weight, i.e. a smaller degree of polymerization, and, as a result, the inventors found out that a liquid drop with the above-mentioned size can be obtained by using an organic material having a certain polymerization degree, which can form an oligomer (generally around or less than an icosamer), preferably a dimer to decamer.

As described above, for the conventional, coated-type organic EL light-emitting element, a size of a light-emitting area of the organic EL light emitting element cannot be reduced to 70 μm×70 μm or less. This means that when a length of one side of a light-emitting area is 70 μm or less, a liquid drop will overflow from the area. Therefore, a pixel size corresponding to a 20-inch QHD display, which is, a size of 70 μm×210 μm, is a limit size of the area that can be formed in the conventional, coated-type organic EL light-emitting element. Even with this size of light-emitting area, various improvements to an insulation bank were needed, as described above. Those improvements are described below. The exemplary organic EL light-emitting element according to the present application will be described in the followings by referring to FIGS. 1A to 1C, in which an insulation bank 23 is formed in a periphery of a first electrode 22, and an organic layer 26 is coated on the first electrode 22 in an opening 23a surrounded by the insulation bank 23. This organic layer 26 forming area constitutes a light-emitting area. When a plurality of organic EL light-emitting elements are arranged in matrix form on the organic layer 26 to form a display apparatus, a second electrode 27 (see FIG. 1C) may be formed across the entire surface continuously.

In the conventional, coated-type organic EL light-emitting element having such a structure, when the organic EL light-emitting elements are arranged in matrix form in a display apparatus, a coating solution overflows an opening 23a surrounded by the insulation bank 23 and spreads to neighboring light-emitting s area since a liquid droplet volume per one drop ejected by an ink-jet process is large, as described above. To avoid this problem, the surface of a sidewall of the opening 23a surrounded by the insulation bank 23 and the top surface of the insulation bank 23 are formed to have a liquid repellent property. With such a liquid repellent treatment, a dripped coating solution is likely repelled by the insulation bank 23 even when the volume of the dripped coating solution is larger than a volume within the opening 23a, and the coating solution is pulled into a spherical shape due to a surface tension of the coating solution, raised in the vertical direction and kept in an opening 23a, without overflowing the insulation bank 23 and spreading to areas of neighboring light-emitting elements from a small light-emitting area. To obtain such a liquid repelling property, an insulation bank 23 is need to be either formed by a fluorine resin containing fluorine, such as a polyamide containing fluorine, or a silicone resin, or subjected to a plasma treatment for treating a surface of the insulation bank 23 by, for example, $CF_4$ based gas, both of which can be a difficult work and may increase a manufacturing cost. There is also a possibility that an effusion of fluorine from a material of an insulation bank to an organic layer or an exposure to the fluorine gas may have an adverse effect. Further, it seems difficult to completely prevent the wetting spread of the coating solution to the neighboring light-emitting areas.

Further, as for other attempts for the improvement of the coated-type organic EL light-emitting element, an attempt to increase a height h1 of an insulation bank 23 from a first electrode 22 (see FIG. 1A, hereinafter simply referred to as "a height of an insulation bank 23") has been made. In this attempt, an insulation bank 23 is formed so as to have a height h1 of 2 μm or more, resulting in an increment of a volume within an opening 23a, and thus, a rather large liquid drop can be kept in an opening 23a. However, when a height h1 of an insulation bank 23 is increased, a height difference between a surface of an organic layer 26 and a top surface of the insulation bank 23 will become large. This leads a problem in that a second electrode 27 which is formed across an entire surface of an organic layer 26 and top surface of the insulation bank 23 is likely disconnected stepwisely. To prevent this stepwise disconnection problem, it is necessary to form a second electrode 27 to have a thickness of 1 μm or more. This causes problems in that a time required for forming a second electrode 27 will become longer, and that more material will be needed for forming a second electrode 27, which results in an increment in the cost, and in addition to these problems, light is hardly transmitted through such an electrode. As a result, this causes a problem in that an organic EL light-emitting element of a top emission type, in which light is taken out from a top surface, i.e. from a surface including the second electrode 27, cannot be produced. Further, when the height of the insulation bank is increased, light emissions in oblique directions may be blocked, resulting in poor viewing angle characteristics. Further, in order to form an insulation bank with a high height, it is necessary to form an insulation bank in such a way to have a large width. This demands a wide pixel pitch, causing the problem in that a high definition pattern is hard to be obtained.

Further, as for other attempts, an attempt to prevent a coating solution from spreading over a neighboring light-emitting area has been made by forming an insulation bank 23 in a ray to have a reversed tapered shape (the shape in which a spacing between sidewalls of the insulation bank 23 in a vertical cross sectional view is decreased from a surface of the first electrode 22 toward a top surface of the insulation bank 23, i.e. a reversed shape of a forward tapered shape). However, making such a reversed tapered shape is difficult, and further, it causes a problem in that a stepwise disconnection of a second electrode 27 which is formed across an entire surface of an organic layer 26 and top surface of the insulation bank 23, as described above, may occur more frequently. Therefore, a stepwise disconnection problem of the second electrode 27 will become even severe compared to in the above-described attempt to increase a height h1 of the insulation bank 23, and thus, it is necessary to form a second electrode 27 much thicker.

In other words, in the conventional, coated-type organic EL light-emitting element, it was necessary to make an insulation bank 23 liquid repellent, to form an insulation bank 23 in a way to have a reversed tapered shape, or to increase a height of an insulation bank 23. This caused the problems that, for example, the manufacturing process became complex as well as an organic layer 26 was deteriorated due to an effusion of fluorine or an exposure to the fluorine gas involved in a liquid repellent treatment.

On the other hand, in an exemplary embodiment according to the present application, by using an organic material with a smaller degree of polymerization, which is neither a polymer compound nor a low molecule weight compound and has a molecular weight of 300 or more and 5000 or less, preferably about 3000 or less, more preferably 500 or more and 1000 or less, in other words, by using an organic material of an oligomer, preferably an oligomer from a dimer to a decamer, as an organic material to be dissolved in a coating solution, a small liquid drop of a coating solution having a volume per one drop of about 0.05 pL or more and about 1 pL or less was obtained. This enables to form an insulation bank 23 to have a smaller height h1 since there is no possibility that a coating solution 25a overflows an opening 23a (see, FIGS. 1A and 1B). A coating solution 25a will not overflow even if a height h1 of an insulation bank 23 is, for example, about 1 µm or less.

Further, according to the presently illustrated embodiment, there is no need to form an insulation bank 23 in a reversed tapered shape. Thus, an insulation bank 23 may be formed in a forward tapered shape or in a shape in which a sidewall of the insulation bank 23 is substantially perpendicular to a surface of the first electrode 22. Namely, an insulation bank 23 may be formed to have a taper angle θ to the horizontal plane of a sidewall of the insulation bank 23 (see, FIG. 1A) of 10° or more to 90° or less, for example, preferably an insulation bank 23 may be formed in a forward tapered shape such as to have a taper angle θ of about 80° or less. As a result, a stepwise disconnection problem of the second electrode 27 can be further avoided. In other words, according to the presently illustrated embodiment, the insulation bank 23 can be formed to have a taper angle θ to the horizontal plane of the insulation bank 23 (see, FIG. 1A) of 10° or more to 90° or less. In this case, the insulation bank 23 can be manufactured more easily compared to an insulation bank 23 with a reversed tapered shape. The insulation bank 23 may also be formed in a forward tapered shape with a taper angle θ of, for example, about 80° or less. This may further prevent a stepwise disconnection problem of the second electrode 27. As a result, the stepwise disconnection problem never occurs even when the second electrode 27 is formed with a thin thickness, and a light-emitting element can be formed either as a top emission type light-emitting element or as a bottom emission type light-emitting element.

Since a small-sized liquid drop was able to be formed as described above, the organic layer 26 was formed successfully and precisely even in a light-emitting area having a much smaller size compared to the conventional size of 70 µm×210 µm, such as a small-sized light-emitting area of about 10 µm×10 µm, without employing the above-described attempts that had been made for the conventional, coated-type organic EL light-emitting element to the insulation bank 23. As a result, even a light-emitting element to be used for a small, high definition display apparatus such as a smartphone can be formed with a coated-type organic layer. Further, it was found that a concentration of solute in the coating solution can be increased to about 10 mass % to 30 mass % by using an oligomer as an organic material and thus the organic layer can be formed efficiently even in the small light-emitting area.

A coating solution containing an oligomer according to the presently-illustrated embodiment is suitably applicable to an area having a similar size to the conventional, coated-type organic EL light-emitting element. However, it is particularly effective to a light-emitting area of 3500 µm² or less, preferably 2500 µm² or less, which has not been able to be formed from the conventional coated-type organic layer.

Since there is no need to form a surface of the insulation bank 23 to have a liquid repellent property, there is no need to use a fluorine-based resin or a fluorine-containing copolymer of, for example, a polyamide and a fluorine resin as a resin material for an insulation bank 23, and a plasma treatment of a surface of the formed insulation bank 23 by, for example, $CF_4$ based gas is also not necessary. Not only that this makes a manufacturing process of an element very simple and the cost for manufacturing can be reduced, but also it can exclude an adverse influence that may be caused by an effusion of fluorine from the insulation bank 23 or by an exposure to a fluorine-based gas represented by $CF_4$. As a result, a life prolongation of the element may be achieved. Therefore, in the presently illustrated embodiment, it may be preferable to form an insulation bank 23 by a non-fluorine-based resin which does not contain fluorine. In particular, the exemplarily examples of a resin may include, for example, a silicon oxide, a silicon nitride, a silicon oxynitride, an acrylic resin, a polyimide resin, and a novolak-type phenol resin. Specifically, a resin is preferably, but not limited to, a polyimide-based resin containing no fluorine. Further, in the presently illustrated embodiment, not only is there no need to form a surface of an insulation bank 23 to have a liquid repellent property as described above, but also a surface of an insulation bank 23 may be even formed so as to have a hydrophilic property. Therefore, any hydrophilic resins, in which a polar functional group is formed on a surface of a resin and thus a surface of a resin is hydrophilic, may be used for a resin material for an insulation bank 23. In particular, the exemplarily examples of a hydrophilic material may include, but not limited to, a resin such as polyimide or polyamide. A resin having a hydrophilic property as referred herein involves a resin with no liquid repellent property as well as a resin to which no specific treatment, i.e. no liquid repellent treatment, has been conducted, and this may be advantageous because when an inside of an opening 23a surrounded by the insulation bank 23 is formed to have a hydrophilic property, a dripped coating solution may be easily spread up to a peripheral portion of a first electrode 22. As a result, the first electrode 22 can be covered with a coated layer, up to a peripheral portion of the first electrode 22. This may exclude a possibility of an occurrence of short circuit between the first electrode 22 and the second electrode 27 which is formed on an organic layer 26 after a formation of the organic layer 26 from a coated layer.

For example, a contact angle of a surface of a sidewall of an insulation bank 23 to water may be set to about 15° or more and 60° or less. By setting a contact angle of a surface of a sidewall of an insulation bank 23 to water to 60° or less, a coating solution being dropped inside an opening 23a and thinly spreading on a surface of a first electrode 22 (a bottom of an opening 23a) exposed in an opening 23a (not covered by an insulation bank 23) can wet and spread until the coating solution is in contact with a sidewall of the insulation bank 23, and can form a coated layer with an almost uniform thickness. Further, the coating solution that reaches a sidewall of the insulation bank 23 creeps up the sidewall of the insulation bank 23 (see FIG. 1B). Accordingly, in a process in which a formed coated layer is dried to form an organic layer, an aggregation of a solute component onto a central part of a first electrode 22 within an opening 23a hardly occurs. After a concentration of the coated layer reaches to a critical concentration by being dried, a height h3 of a contact point between an organic layer 26 formed by drying a coated layer and a sidewall of the insulation bank 23 (a pinning position) from a surface of a first electrode 22 will be greater than a height h2 of the thinnest part of an organic layer 26 from a surface of a first electrode 22, as shown in FIG. 1C.

As described above, when an insulation bank 23 is formed to have a forward tapered shape with a taper angle θ to the horizontal plane of 80° or less, a force to keep a coating solution in an opening 23a may become weaker compared to an insulation bank 23 with a taper angle θ close to 90°. Consequently, coating can be performed so as to have a further uniform layer thickness, and also an area of an organic layer 26 having a uniform layer thickness may be extended. Further, since a flat organic layer 26 can be formed on an area of a first electrode 22, which rill constitute each pixel, to the maximum extent possible, it is particularly advantageous when a size of a pixel is small since the area can be effectively used as a light-emitting area.

Further, an insulation bank 23 may be formed to have a more hydrophilic surface by conducting a surface modifying treatment to a surface of the insulation bank 23 after the formation of the insulation bank 23. By conducting a surface modifying treatment, a surface of an insulation bank 23 may be treated to have a surface roughness of preferably 30 nm or less, such as in the range of about 5 nm or more and 30 nm or less, in arithmetic average roughness (Ra). It is considered that when a surface of an insulation bank 23 has a fine uneven structure on this scale, an insulation bank 23 can show a good hydrophilicity even to a small droplet of a coating solution according to the presently illustrated embodiment which has a volume per one drop of about 0.05 pL or more and 1 pL or less. The exemplarily examples of a treatment method to conduct such a surface modification will be described below, and may include, for example, a rehardening of an insulation bank 23 or an exposure to a dissolving solvent.

The surface of the insulation bank 23 may also be formed to have a hydrophilic property by conducting a surface modifying treatment, such as UV irradiation treatment, ozone treatment, plasma surface treatment. By conducting a UV irradiation treatment or ozone treatment, chemical bonding in a surface layer of the insulation bank 23 is cleaved by UV or ozone and active oxygen derived from ozone or ozone reacts with a molecule whose chemical bonding is cleaved, and then a polar functional group with a hydrophilic property including, for example, a carboxy group, hydroxy group, aldehyde group, acrylic group, and amide group will be introduced into the surface layer of the insulation bank 23. By conducting a plasma surface treatment, the excited active species generated during plasma discharge act on a surface of the insulation bank 23, and then various hydrophilic functional groups will be introduced onto a surface of the insulation bank 23 depending on the type of a plasma source gas. As a plasma source gas, a gas such as argon, nitrogen, hydrogen, ammonia and oxygen may be used and can be selected accordingly. Further, conducting a plasma surface treatment will have an advantage when being applied to an insulation bank 23 formed from an organic material in that only a surface of the insulation bank 23 can be mainly modified and the time required for the treatment will be short. Either plasma surface treatment can form a hydrophilic surface through an introduction of the above-described polar functional group onto a surface of the insulation bank 23.

As described above, the inventors found out that by applying a compound, which has a molecular weight of about 300 or more and 5000 or less, preferably about 3000 or less, more preferably about 500 or more and 1000 or less and a degree of polymerization similar to the degree the oligomers have, as an organic material for an coated-type organic layer 26, a coating solution can drip as a small droplet which has a volume per one drop of about 0.05 pL or more and 1 pL or less and a nearly spherical shape to an opening 23a surrounded by the insulation bank 23 which has a hydrophilic surface. Even when the area of a surface of the first electrode 22 exposed in the opening 23a is, for example, 100 µm$^2$ or more and 2500 µm$^2$ or less, preferably 1200 µm$^2$ or less, more preferably 850 µm$^2$ or less, or, 520 µm$^2$ or more and 850 µm$^2$ or less, in other words, 17 µm×50 µm or less for a high definition panel of a medium or large size, or 25 µm×25 µm or less for a high definition panel of a small size, such as a hand-held display apparatus, or a small area where a length of one side is about 10 µm, a coated-type organic layer can be obtained on that area via an ink-jet process by setting a size of an ejecting port of a nozzle of an ink-jet apparatus to about 10 to 20 µm in diameter. Therefore, an organic EL light-emitting element according to the presently illustrated embodiment can form a pixel of the organic EL display apparatus, which has a resolution around 500 ppi or a higher pixel density for an apparatus with a size of the smartphone.

However, an upper limit of a size of the area to which an organic layer 26 is formed is not limited to the ones described above. When the area is large, a cross-sectional area of an ejecting port of a nozzle will be increased so that even a large area may be formed in a relatively short time. Thus, the above-mentioned length for one side of the pixel having a rectangular shape is merely an example and a size of the area may be any sizes that correspond to a various pixel shapes for the desired display apparatus. When the shape of an area to be coated is a rectangular shape, and if a length of one side of the rectangular shape is too small (a width of the rectangle is too narrow), it becomes impossible to apply a liquid drop to the area precisely. Therefore, when a shape of the area to which an organic layer 26 will be formed has a rectangular shape, it may be preferable that a short side of the rectangle is 10 µm or more. In other words, a squared value of this lower limit of a length of the short side will be a lower limit of a size of a pixel which can be formed by the presently illustrated embodiment. It should be appreciated that a shape of the area to which an organic layer 26 will be formed, i.e. a shape of a pixel, is not limited to a rectangular shape or a square shape, and may be a round shape, elliptic shape, or polygon.

In the presently illustrated embodiment, as described above, even when a coating solution 25a is coated to a small light-emitting area surrounded by an insulation bank 23 formed by a hydrophilic resin material, there is no risk for a coating solution 25a to overflow an insulation bank 23. As a result, an organic layer was formed successfully by a coating process even on an area of the light-emitting area formed with the above described high definition pattern without an occurrence of color mixing problem. Since an insulation bank 23 is formed by a hydrophilic resin material and thus a surface of an insulation bank 23 is hydrophilic, the organic layer 26 evenly fills a space from a bottom of an opening 23a to a sidewall of an opening 23a As a result, an organic layer 26 with an improved flatness can be obtained, preventing an occurrence of a luminance unevenness or a light emission color unevenness.

An organic layer 26 may include one or more organic layers such as a hole transport layer or an electron transport layer, other than a light-emitting layer. In case where the organic layer 26 is formed with a plurality of layers, a material for each layer should be an organic material containing an oligomer as mentioned above. Further, an organic layer 26 according to the presently illustrated embodiment may further include an optional layer between the organic layer 26 and a first electrode 22 or a second electrode 27, or between each of the organic layers when the organic layer 26 is formed by one or more organic layers. Further, a TFT (not indicated) or a planarization layer (not indicated) and so on may be formed on a substrate 21. It should be noted that an organic EL light-emitting element shown in FIGS. 1A to 1C according to the exemplary embodiment described below is a top emission type, however, as described above, it may be formed either for a bottom emission type or a both sides emission type.

An organic EL light-emitting element according to the presently illustrated embodiment may be applicable to an illumination apparatus by sealing one or more organic EL light-emitting elements with an envelope (a covering layer) which has at least a translucent front surface, or to a display apparatus by arranging a plurality of light-emitting elements in matrix form. When applied to an illumination apparatus, light-emitting elements of three colors, red (R), green (G) and blue (B) are enclosed in one envelope, providing a white light emitting illumination apparatus. A white light or a light of any other desirable colors emitting illumination apparatus may be also formed by covering a monochromatic light emitting element by a fluorescent resin.

When applied to a display apparatus, sub-pixels of three colors, R, G and B are formed respectively for each pixel (one pixel) arranged in matrix form, providing a full-color display apparatus. In this case, a size of each sub-pixel is about one-thirds of the size of one pixel, and its area is smaller than the area of one pixel. A material for an organic layer for each sub-pixel and a planar shape of a sub-pixel could be different each other, however, a layered structure formed with, for example, a first electrode 22, an organic layer 26, a second electrode 27 is same, and thus a sub-pixel is herein described as one light-emitting element (one pixel) without distinguishing a sub-pixel from a pixel. An arrangement of the pixels is not particularly limited, and the pixels may be arranged, for example, in a mosaic arrangement, a delta arrangement, a stripe arrangement, and a pentile arrangement. In each pixel, a first electrode 22 of an organic EL light-emitting element is connected to a driving element, and a predetermined color corresponding to each pixel is emitted by the on-off control of each pixel and various luminescent colors are realized by mixing different colors.

A substrate 21 may be a support substrate formed with, for example, a glass plate, a polyimide film. In case where the substrate 21 does not need to be translucent, a metal substrate or a ceramics substrate may be used as well. When applied to a display apparatus, though FIGS. 1A to 1C do not illustrate completely, a driving element such as TFT is formed on a position corresponding to an arrangement place for a pixel. A planarization layer, which is formed by a material such as acrylic resin or polyimide, may be formed on a driving element for planarization. A material for a planarization layer is not limited to those described above, and may be an inorganic material such as $SiO_2$, SOG, however, an organic material may be preferable to be applied in order to eliminate irregularities of the surface easily. Further, a first electrode 22 is formed by a combination of a metal layer such as Ag or APC and an ITO film at a portion of a surface of the planarization layer which corresponds to an area to which an organic EL light-emitting element is formed. An organic layer 26 is coated on the first electrode 22.

An insulation bank 23, which is formed by a hydrophilic resin material including, for example, a silicon oxide, a silicon nitride, a silicon oxynitride, an acrylic resin, a polyimide resin, and a novolak-type phenol resin, is formed around a first electrode 22 which constitutes each pixel, as described in FIGS. 1A to 1C, in order to divide pixels as well as to prevent a contact between the first electrode 22 and the second electrode 27. The insulation bank 23 is formed in such a way that it surrounds at least part of the first electrode 22. As shown in FIG. 1A, in the presently illustrated embodiment, the insulation bank 23 is formed in such a way that it covers a peripheral portion of the first electrode 22 which is formed in a predetermined area. However, an insulation bank 23 may be formed so as to contact with the first electrode 22 without covering the first electrode 22 or formed separately from the first electrode 22. In other words, an insulation bank 23 may be formed to surround a larger area than the area to which the first electrode 22 is formed. However, the area to which the light-emitting element is formed is very small, as described above, it may be preferable to form the insulation bank 23 so as to overlap with a peripheral portion of the first electrode 22.

In either case, it is important to form a layered structure in which the first electrode 22 and the second electrode 27, which is formed after a formation of the organic layer 26, are never in contact with one another (inducing a leakage). Therefore, as described above, it may be preferable that an organic layer 26 is provided in an area surrounded by an insulation bank 23 so as to cover an entire surface of the first electrode 22 which is exposed in an opening 23a surrounded by the insulation bank 23. A second electrode 27 may be formed on the organic layer 26. However, an organic layer 26 may be formed on the first electrode 22 to have a size smaller than the size of the first electrode 22 without covering an entire surface of the first electrode 22, and a second electrode 27 may be formed on the organic layer 26 to have a size further smaller than the size of the organic layer 26.

Among the coated-type organic layers 26, organic materials each correspond to a color from R, G, and B may be used for each of light-emitting layers. However, a light-emitting layer may be formed using the same material, and a color filter may be provided on the surface of the light-emitting layer to obtain a color R, G, or B through a color filter. Further, the organic layer 26 other than a light-emitting layer may include a hole transport layer or an electron transport layer, or a layered structure thereof. In case where a light-emitting property is considered the most important, it may be preferable to coat a material suitable for a light-emitting layer separately for forming such a hole transport layer or such an electron transport layer. However, when using a coating process, it is possible to form an organic EL light-emitting element with a coated-type organic layer 26 which includes a fewer number of layers by mixing organic materials each of which forms respective layers.

For example, in order to form the organic layer 26, as described, for example, in FIG. 1A, a coating solution 25*a* of an organic material containing an oligomer is dropped onto a first electrode 22 surrounded by an insulation bank 23 from a nozzle 31 of an ink-jet apparatus. An organic compound having a structure, in which two or more and 10 or less of monomers, preferably two or more and five or less of monomers, containing a structural unit which contributes to an light-emitting property of the material generally applicable to a light-emitting layer of the organic EL light-emitting element are polymerized, may be used as an oligomer. The material generally applicable to a light-emitting layer of the organic EL light-emitting element refers to, for example, materials used as the conventional, dye-based material or polymer material. Specifically, an oligomer according to the exemplary embodiment may be a compound obtained by a polymerization of 2 to 10 monomers, which include a structural unit represented by a general formula (I): —[Y]—, wherein Y includes a skeleton selected from, for example, a triarylamine skeleton, an oxadiazole skeleton, a triazole skeleton, a silole skeleton, a styrylarylene skeleton, a pyrazoloquinoline skeleton, an oligothiophene skeleton, a rylene skeleton, a perinone skeleton, a vinyl carobazole skeleton, a tetraphenylethylene skeleton, a coumarin skeleton, a rubrene skeleton, a quinacridone skeleton, a squarylium skeleton, a porphyrin skeleton, and a pyrazoline skeleton.

With a dropping of a coating solution 25*a*, a coated layer 25 is formed as described in FIG. 1B. The coated layer 25 spreads into an area surrounded by an insulation bank 23, which serves as a dam, and remains in the area, and can stick to an insulation bank 23 without forming a spherical shape since the insulation bank 23 does not have a liquid repelling property, thereby a surface of the coated layer 25 is planarized. By drying this, a solvent component in the coating solution 25*a* is evaporated, providing a thickness being about one-thirtieth of the thickness of the coated layer 25, for example, about 10 to 20 nm per one layer (per one material). By conducting this coated-type organic layer 26 formation process repeatedly with necessary materials, a coated-type organic layer 26 with a pinning position that is provided in a position such that a height of the pinning position from a surface of the first electrode 22 is greater than a height of the thinnest part of an organic layer 26 from a surface of a first electrode 22 is formed as shown in FIG. 1C. In FIG. 1C, the coated-type organic layer 26 is descried in one layer, however, as described above, in general the coated-type organic layer 26 will be formed with a plurality of layers.

As described above, in the presently illustrated embodiment, the element is a top emission type in which a light is emitted from the surface of the element which is the opposite to the surface including a substrate 21 in FIGs, and thus a second electrode 27 formed on the organic layer 26 is formed of a translucent material such as a thin eutectic layer composed of magnesium and silver. Other materials such as aluminum can be also used. It should be noted that in case where the element is a bottom emission type in which a light is emitted through the substrate 21, a material such as ITO, $In_3O_4$ may be used for a first electrode 22 and a metal having a small work function such as Mg, K, Li, Al may be used for a second electrode 27. On the surface of the second electrode 27 a protection layer (a covering layer) 28 (see FIG. 1C) may be formed. This covering layer 28 may be replaced with a seal layer (an envelope), which is described below. It may be preferable to form a protection layer 28 with a plurality of layers that are formed by the material such as $Si_3N_4$, $SiO_2$, since such a protection layer 28 could provide a fine layer quality. The whole part may be sealed by a seal layer (not indicated) formed by, for example, a glass or a resin film with a moisture-resistant property so as to be formed such that the organic layer does not absorb water.

As described above, since the organic material for an organic layer 26 according to the presently illustrated embodiment is an oligomer, for example, with a polymerization degree of 2 to 10, having a molecular weight of 300 to 5000, the organic material has a solubility to a solvent sufficient to be applied for a coating solution 25*a* for ink-jet process which is ejected from a nozzle of ink-jet apparatus to form a coated layer 25 by coating. A concentration of the oligomer in the coating solution 25*a* according to the presently illustrated embodiment may be adjusted to a concentration which enables to form an organic layer 26 with a desirable thickness, and it can be, for example, about 10 mass % to 30 mass %. Further, since the oligomer has the above described polymerization degree, only the oligomer having a desirable polymerization degree can be isolated and purified after the synthetic reaction by a purification method such as a separation by a chromatography including a column chromatography and gel permeation chromatography, a reprecipitation, a recrystallization. In the presently illustrated embodiment, the oligomer which is highly purified and has no molecular weight distribution can be used as an organic material for the organic layer 26, and thus, the color purity and brightness can be enhanced when such an organic material is applied to an organic EL light-emitting element compared to the element where an organic material containing a polymer compound which is not easily purified and difficult to be obtained as a highly purified compound is used. Also, to use an oligomer of the organic material as an organic material may prevent a crystallization or aggregation of the organic material when being coated, and thus, a stability of a layer of the organic layer 26 to be formed may be increased compared to the layer formed from the organic material containing a low molecule weight compound which is, for example, crystalized easily in general. If a crystallization or aggregation of the organic material occurs in the organic layer, a brightness of the area in which a crystallization or aggregation occurs and a layer thickness is relatively increased relatively decreased because an amount of the current to be injected is reduced compared to the area in which such a crystallization or aggregation does not occur, possibly causing variation in the distribution of the light emission intensity within a pixel. Also, there would be a possibility that the lifetime of the element itself may be shortened because of a deterioration occurred in the area having a thin thickness due to a concentration of current in the area having a relatively thin thickness. The occurrence of this kind of problems can be prevented by using an oligomer of the organic material of the exemplary embodiment of the present application for an organic layer 26 of the light-emitting element. Therefore, an organic EL light-emitting element with a high definition having a long lifetime and superior light emission intensity can be provided by a method for manufacturing a coated-type element using a relatively inexpensive printing method.

In one embodiment of the present application, an organic layer 26 of the organic EL light-emitting element may include one or more organic materials which have a superior property such as a hole transport property or an electron transport property, in addition to the light-emitting organic material, as described above. For example, a coating solution 25a containing a composition formed by mixing an oligomer of an organic material which is a light-emitting material and a compound having a hole transport property or an electron transport property may be used for a formation of the organic layer 26. An oligomer of different kinds of organic materials, for example, an oligomer as a light-emitting material and an oligomer having a hole transport property, may be mixed and used to form an organic layer 26 through a coating process. It should be noted that a combination of the materials is not limited to those described above. This may enable to reduce a number of layers in the organic layer 26 of the organic EL light-emitting element. Further, this may improve a flatness of the organic layer 26 and prevent an occurrence of a display unevenness such as a luminance unevenness or a light emission color unevenness when the organic layer 26 emits light.

Figure 3:
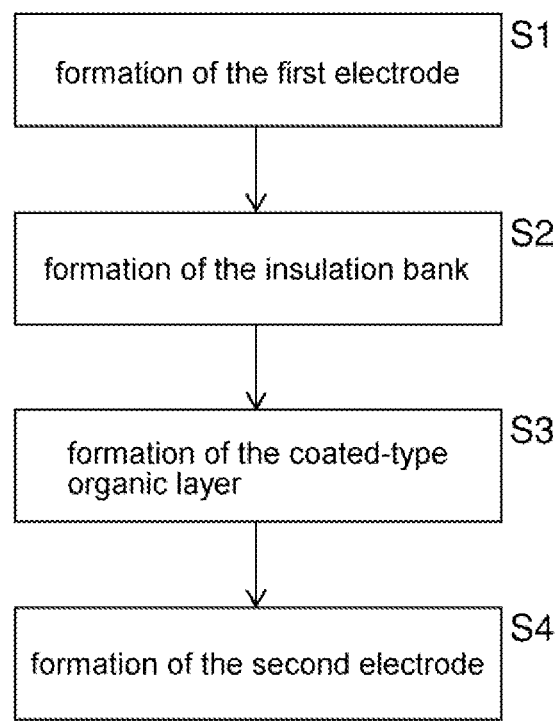
FIG. 3 shows a flowchart of a manufacturing process according to one embodiment of the present application.

Referring to a flowchart in FIG. 3, an method of manufacturing an organic EL light-emitting element according to the second embodiment of the present application include forming a first electrode 22 on a surface of a substrate 21 (S1), forming an insulation bank 23 to surround at least part of the first electrode 22 (S2), forming a coated-type organic layer 26 on an area of the first electrode 22 surrounded by the insulation bank 23 (S3), and forming a second electrode 27 on the organic layer 26 (S4). The insulation bank is formed using a hydrophilic material and to have a contact angle to water of 15° or more and 60° or less. Further, this organic layer 26 is formed by dropping a droplet of a liquid composition comprising the above described oligomer of an organic material using an ink-jet process. More detailed description will be followed below.

When applying the light-emitting element to an organic EL display apparatus, as described above, a driving TFT, for example, which forms a driving circuit on the substrate 21, is formed with an amorphous semiconductor, for example, by a usual method using a lithography process, for example. It is planarized by, for example, using a polyimide resin to planarize irregularities of the surface. The first electrode 22 is formed in matrix form according to an arrangement of each pixels on its surface. This first electrode 22 is also formed by forming the above described material for electrode on the entire surface and being subjected to a patterning process (S1).

Subsequently, the insulation bank 23 is formed (S2). This insulation bank 23 may be formed by an inorganic material such as a silicon oxide, a silicon nitride, a silicon oxynitride, or, if a thicker layer is required, it may be formed in a short time by using a hydrophilic resin material such as an acrylic resin, a polyimide resin or a novolak-type phenol resin. The exemplarily examples of a preferable material may be a photosensitive resin material among the above-described resin materials, more preferably a photosensitive polyimide resin. For example, an insulation bank 23, which is formed of a cured material of a photosensitive resin material and includes an opening 23a that exposes at least part of the first electrode inside thereof as illustrated in FIG. 1A, is formed by (i) forming an insulation layer on the entire surface with a thickness of, for example, about 1 μm, which should provide a sufficient height for an insulation bank 23, and (ii) being subjected to a pattering process using a photolithography technique. An insulation bank 23 may be formed in a forward tapered shape as described above, or in a shape in which a sidewall of the insulation bank 23 is substantially perpendicular to the first electrode 22. In the presently illustrated embodiment, a volume per one drop of a liquid droplet of a coating solution 25a is small and thus there is no possibility that a dripped coating solution 25a overflows an opening 23a, and therefore, an occurrence of color mixing problem can be prevented, even when an insulation bank 23 has a forward tapered shape with a taper angle θ to the horizontal plane of about 80 or less degree. Further, when the opening 23a is formed by a photolithography process and even in case a sidewall of an opening 23a and a top surface of an insulation bank 23 are connected to each other to form a curved shape, there is no risk for a dripped coating solution 25a to overflow an insulation bank 23. Therefore, an insulation bank 23 can be easily formed using a photosensitive resin material such as a polyimide resin.

A surface modifying treatment such as ashing or plasma treatment may be conducted to a surface of the first electrode exposed in the opening 23a after the formation of the insulation bank 23. This makes it possible, for example, to provide a hydrophilic property to a surface of the first electrode 22, to remove (be cleaning) an organic substance adhered to a surface of the first electrode 22, or to adjust a work function near the surface of the first electrode 22. Further, this can make an adhesive strength between an organic layer 26 to be formed on a first electrode 22 and a first electrode 22 stronger.

Further, a surface modifying treatment may be conducted to a surface of a sidewall of the opening 23a surrounded by of the insulation bank 23. For example, this kind of surface modifying treatment can be conducted by rehardening a surface of an insulation bank 23 after the insulation bank 23 was formed in a desirable shape. For example, after an insulation bank 23 is cured at a curing temperature of the resin material, the insulation bank is baked at a temperature higher than the curing temperature, for example, the temperature about 15° C. to 30° C. higher than the curing temperature, for about 5 min to 30 min, for example. This temporarily softens the surface of the insulation bank 23, and then the surface of the insulation bank 23 is rehardened. This can improve a flatness of the surface of the insulation bank 23. Alternatively, a modifying treatment may be conducted, for example, by exposing an insulation bank 23 formed in a desired shape to an atmosphere of the solvent that can dissolve the resin material for an insulation bank 23 for about 5 min to 30 min. These surface modifying treatments enable to modify a surface of the insulation bank 23 into the surface having an arithmetic average roughness of about 5 nm or more and 30 nm or less. This can improve a hydrophilicity of a surface of the insulation bank 23.

A surface modifying treatment, such as UV irradiation treatment, ozone treatment, plasma surface treatment may be conducted to the surface of a sidewall of the opening 23a surrounded by the insulation bank 23. This kind of modifying treatments increase a surface free energy of the surface of the insulation bank 23, resulting in an improvement of the hydrophilicity of the insulation bank 23. By forming an insulation bank 23 using a hydrophilic resin material as described above or by conducting a surface modifying treatment as described above, the insulation bank 23 will be formed such that a surface of the insulation bank has an excellent hydrophilicity, for example, a contact angle of a surface of the insulation bank to water is 15° or more and 60° or less.

And then, a coating solution 25a of the above mentioned organic material is ejected from a nozzle 31 by an ink-jet process, as illustrated in FIG. 1A. The ejection of the coating solution 25a is conducted by aligning the nozzle 31 to the first electrode 22 exposed in the opening 23a surrounded by the insulation bank 23. As illustrated in FIG. 1B, an ejected coating solution 25a forms a coated layer 25 in the opening 23a surrounded by the insulation bank 23 (S3).

In particular, as illustrated in FIG. 1A, a coating solution 25a of an organic material containing the oligomer according to the embodiment of the present application is ejected from a nozzle 31 of the ink-jet apparatus and drips on an area of the first electrode 22 surrounded by the insulation bank 23. A coating solution 25a may be a liquid composition containing at least an oligomer according to the embodiment of the present application and a solvent. Any solvents capable of dissolving an organic material containing an oligomer according to the embodiment of the present application may be used, and preferably an organic solvent may be used. Examples of the organic solvent is not particularly limited, however, when a low-boiling point solvent is used as a solvent, this would cause a clogging in the nozzle of ink-jet apparatus, or, a thickness unevenness would be occurred since drying of a coating solution 25a may begin right after being ejected from a nozzle 31 and a solute may be precipitated. Therefore, a low-boiling point solvent may be preferably used in combination with a solvent having a higher boiling point. For example, as the solvent, a chlorine based solvent, ether based solvent, aromatic hydrocarbon based solvent, aliphatic hydrocarbon based solvent, ketone based solvent, ester based solvent, alcohol based solvent, amide based solvent, and a mixed solvent thereof are exemplified. Among them, a mixed solvent containing cyclohexylbenzene, xylene or anisole, or one or more of those may be preferable in terms of, for example, an evenness of a formed layer and viscosity property of a coating solution 25a, but a solvent is not limited to those. A coating solution 25a may be prepared to have a viscosity at 25° C. of about $0.6 \times 10^{-3}$ Pa·s or more and about $3 \times 10^{-3}$ Pa·s or less, preferably about $1 \times 10^{-3}$ Pa·s or less. With a viscosity of this range, a coating solution 25a can be ejected from an ink-jet head as a droplet having a substantially constant particle diameter, and a steady ejection from the ink-jet apparatus can be realized even when using an apparatus provided with multiple nozzles.

Subsequently, a eutectic layer composed of magnesium and silver, for example, is formed by, for example, a vapor-deposition on the entire surface to form a second electrode 27 on the organic layer 26 (S4). In the organic EL light-emitting element according to the presently illustrated embodiment, the second electrode 27 serves as a cathode. An example of the material which constitutes a second electrode 27 is as described above, and the second electrode 27 is formed of a thin metal layer to have a thickness of about 5 nm or more and 30 nm or less. The second electrode 27 is formed on the entire surface including the top surface of the insulation bank 23, since it is formed as a common electrode for each pixel.

Next, a protection layer 28 which serves as a seal layer to prevent a penetration of water and/or oxygen from the outside is formed on the second electrode 27. This protection layer 28 may be an inorganic layer formed of, for example, $Si_3N_4$ or $SiO_2$, which has no hygroscopic property and may be formed by bonding to a substrate 21 (not indicated) in such a way to entirely cover the second electrode 27 and organic layer 26 and so on. Consequently, the organic EL light-emitting element of the embodiment of the present application is completed (see FIG. 1C). This method is described herein as merely an exemplary example, and a method of manufacturing an organic EL light-emitting element of the embodiment of this application may further include optional steps between each step. For example, when a coating solution 25a is dropped multiple times on different positions in an area surrounded by the insulation bank 23 as described above, a planarization process may be conducted to planarize a coating solution 25a dripped in the area before the drying process of the coated layer 25.

As described above, by using an organic material containing an oligomer of the organic material as an organic material for the organic layer 26 of the organic EL light-emitting element and by forming a insulation bank 23 using a hydrophilic resin material, a coated-type organic layer 26 can be provided excellently on an small-sized area on the electrode. As a result, a display unevenness such as a thickness unevenness can be reduced, and an organic EL light-emitting element with a high definition pattern having a superior light-emission property can be obtained at a low cost.

(Summary)

(1) An organic electroluminescent light-emitting element according to the first embodiment of the present application includes a substrate, a first electrode provided on a surface of the substrate, an insulation bank formed to surround at least part of the first electrode, an organic layer formed on the first electrode surrounded by the insulation bank, and a second electrode formed on the organic layer, wherein the insulation bank is formed by a material having a hydrophilic property, and the insulation bank has a forward tapered shape or a sidewall of the insulation bank is formed such as to be substantially perpendicular to the first electrode, the organic layer is a coated-type organic layer comprising an oligomer of an organic material, and the oligomer has a molecular weight of 300 or more and 5000 or less.

According to the organic EL light-emitting element of the exemplary embodiment of the present application, a volume per one drop of a liquid drop of a liquid composition to be ejected form a nozzle of the ink-jet apparatus to form a coated layer can be small since the organic material to form a coated-type organic layer contains an oligomer having a molecular weight of 300 or more and 5000 or less, and thus, there is no possibility that a liquid composition overflows the insulation bank and spreads to the electrodes of neighboring pixels. This enables a high definition pattern formation of pixels by coating process. Further, since the insulation bank is formed by a material having a hydrophilic property, a dripped coating solution ejected to form a coated layer may be easily spread onto a surface of the insulation bank, enabling to form the organic layer which evenly fills up to a sidewall of an opening surrounded by the insulation bank. The organic layer with an excellent flatness can be formed on the first electrode.

(2) It may be preferable that a contact angle of a surface of the insulation bank to water is 15° or more and 60° or less. With a surface of the insulation bank having a water contact angle in this range, an excellent hydrophilicity can be obtained.

(3) It may be preferable that the insulation bank is formed by a material selected from a group consisting of a silicon oxide, a silicon nitride, a silicon oxynitride, a polyimide resin, an acrylic resin, and a novolak-type phenol resin. Forming an insulation bank using such a material that has a hydrophilic property makes it possible to form an organic layer with an improved flatness.

(4) It may be preferable that the insulation bank is formed of a cured material of a photosensitive resin material. This makes it possible to easily form a hydrophilic insulation bank.

(5) It may be preferable that a polar functional group is formed on a surface of the insulation bank. With an insulation bank having such a structure, an excellent hydrophilicity can be obtained.

(6) It may be preferable that an angle of the sidewall of the insulation bank to the first electrode is 10° or more and 90° or less. This makes it possible to prevent a stepwise disconnection problem of the second electrode which is formed across an entire surface of an organic layer and top surface of the insulation bank from occurring.

(7) It may be preferable that a pinning position of the organic layer is provided in a position such that a height of the pinning position is greater than a height of a thinnest part of the organic layer, the pinning position being a contact point between the organic layer and the sidewall of the insulation bank. This makes it possible to form an organic layer with an improved flatness and prevent an occurrence of, for example, a luminance unevenness.

(8) Further, a method of manufacturing an organic EL light-emitting element of the second embodiment of the present application includes forming a first electrode on a surface of a substrate, forming an insulation bank by a hydrophilic resin material to surround at least part of the first electrode, forming a coated-type organic layer on an area of the first electrode surrounded by the insulation bank, and forming a second electrode on the organic layer, wherein the insulation bank is formed to have a contact angle to water of 15° or more and 60° or less using a hydrophilic material, and a step for forming the organic layer is conducted by applying a droplet of a liquid composition comprising an oligomer of an organic material using an ink-jet process.

According to the method of manufacturing an organic EL light-emitting element of the second embodiment of the present application, even when a size of pixel is small, an organic EL light-emitting element with an organic layer having an excellent flatness can be formed with a high definition pattern on a pixel electrode by a coating process. Therefore, a small-sized, high definition organic EL light-emitting element can be manufactured easily and inexpensively.

(9) It may be preferable that a step for forming the insulation bank is conducted by forming a layer of a material selected from a group consisting of a silicon oxide, a silicon nitride, a silicon oxynitride, a polyimide resin, an acrylic resin, and a novolak-type phenol resin and by patterning the layer, since this enables a formation of an insulation bank having an improved hydrophilicity.

DESCRIPTION OF REFERENCE NUMERALS 21 substrate
22 first electrode
23 insulation bank
23a opening
25 coated layer
25a coating solution
26 organic layer
27 second electrode
28 protection layer
31 nozzle

The invention claimed is:

1. An organic electroluminescent light-emitting element comprising:
a substrate,
a first electrode provided on a surface of the substrate,
an insulation bank formed to surround at least part of the first electrode,
one or more organic layers formed on the first electrode surrounded by the insulation bank, and
a second electrode formed on the organic layer,
wherein the insulation bank is formed by a material having a hydrophilic property, and a contact angle of a surface of the insulation bank to water is 15° or more and 60° or less, and the insulation bank has a forward tapered shape or a sidewall of the insulation bank is formed such as to be substantially perpendicular to the first electrode,
each of the one or more organic layers is a coated-type organic layer formed of an oligomer of an organic material, and the one or more organic layers comprise a light-emitting layer,
the oligomer of the organic material for the light-emitting layer is a compound obtained by a polymerization of a monomer, the monomer comprising a structural unit represented by a general formula of —[Y]— wherein Y comprises a skeleton selected from a group consisting of a triarylamine skeleton, an oxadiazole skeleton, a triazole skeleton, a silole skeleton, a styrylarylene skeleton, a pyrazoloquinoline skeleton, an oligothiophene skeleton, a rylene skeleton, a perinone skeleton, a vinyl carobazole skeleton, a tetraphenylethylene skeleton, a coumarin skeleton, a rubrene skeleton, a quinacridone skeleton, a squarylium skeleton, a porphyrin skeleton, and a pyrazoline skeleton, and
the oligomer has a molecular weight of 300 or more and 5000 or less.

2. The organic electroluminescent light-emitting element of claim 1, wherein the insulation bank is formed by a material selected from a group consisting of a silicon oxide, a silicon nitride, a silicon oxynitride, a polyimide resin, an acrylic resin, and a novolak-type phenol resin.

3. The organic electroluminescent light-emitting element of claim 1, wherein the insulation bank is formed of a cured material of a photosensitive resin material.

4. The organic electroluminescent light-emitting element of claim 1, wherein a polar functional group is formed on the surface of the insulation bank.

5. The organic electroluminescent light-emitting element of claim 1, wherein an angle of the sidewall of the insulation bank to the first electrode is 10° or more and 90° or less.

6. The organic electroluminescent light-emitting element of claim 1, wherein a pinning position of the organic layer is provided in a position such that a height of the pinning position is greater than a height of a thinnest part of the organic layer, the pinning position being a contact point between the organic layer and the sidewall of the insulation bank.

7. The organic electroluminescent light-emitting element of claim 1, wherein an area of the first electrode surrounded by the insulation bank is 100 µm$^2$ or more and 850 µm$^2$ or less.

8. The organic electroluminescent light-emitting element of claim 1, wherein a height of the insulation bank from a surface of the first electrode is 1 µm or less.

9. A method of manufacturing an organic electroluminescent light-emitting element comprising:
forming a first electrode on a surface of a substrate,
forming an insulation bank by a hydrophilic resin material to surround at least part of the first electrode, forming one or more organic layers comprising a light-emitting layer on an area of the first electrode surrounded by the insulation bank, the one or more organic layers being formed of an oligomer of an organic material, each of the one or more organic layers being formed as a coated-type organic layer, and forming a second electrode on the organic layer, wherein the insulation bank is formed to have a contact angle to water of 15° or more and 60° or less using a hydrophilic material, the oligomer of the organic material for the light-emitting layer is a compound obtained by a polymerization of a monomer, the monomer comprising a structural unit represented by a general formula of —[Y]—, wherein Y comprises a skeleton selected from a group consisting of a triarylamine skeleton, an oxadiazole skeleton, a triazole skeleton, a silole skeleton, a styrylarylene skeleton, a pyrazoloquinoline skeleton, an oligothiophene skeleton, a rylene skeleton, a perinone skeleton, a vinyl carobazole skeleton, a tetraphenylethylene skeleton, a coumarin skeleton, a rubrene skeleton, a quinacridone skeleton, a squarylium skeleton, a porphyrin skeleton, and a pyrazoline skeleton, and a step for forming the light-emitting layer is conducted by applying a droplet of a liquid composition comprising the oligomer of the organic material for the light-emitting layer using an ink-jet process.

10. The method of manufacturing an organic electroluminescent light-emitting element of claim 9, wherein a step for forming the insulation bank is conducted by forming a layer of a material selected from a group consisting of a silicon oxide, a silicon nitride, a silicon oxynitride, a polyimide resin, an acrylic resin, and a novolak-type phenol resin and by patterning the layer.

11. The method of manufacturing an organic electroluminescent light-emitting element of claim 9, wherein the insulation bank is formed such that the area of the first electrode surrounded by the insulation bank is 100 $\mu m^2$ or more and 850 $\mu m^2$ or less.

12. The method of manufacturing an organic electroluminescent light-emitting element of claim 9, wherein the insulation bank is formed such that a height of the insulation bank from a surface of the first electrode is 1 $\mu m$ or less.

* * * * *